United States Patent [19]
Otsuka et al.

[11] Patent Number: 5,834,367
[45] Date of Patent: Nov. 10, 1998

[54] METHOD OF MANUFACTURING SEMICONDUCTOR DEVICE HAVING A MULTILAYER WIRING

[75] Inventors: Mari Otsuka; Kenichi Otsuka, both of Kawasaki, Japan

[73] Assignee: Kabushiki Kaisha Toshiba, Kawasaki, Japan

[21] Appl. No.: 629,944

[22] Filed: Apr. 12, 1996

[30] Foreign Application Priority Data

Apr. 19, 1995 [JP] Japan ................................. 7-093549

[51] Int. Cl.⁶ ................................. H01L 21/283
[52] U.S. Cl. .................... 438/618; 438/620; 438/629; 438/641; 438/648; 438/677; 438/655
[58] Field of Search ..................... 438/618, 620, 438/621, 641, 648, 656, 674, 675, 677, 352, 360, 655, 629

[56] References Cited

U.S. PATENT DOCUMENTS

| | | | |
|---|---|---|---|
| 5,192,713 | 3/1993 | Harada | 438/620 |
| 5,476,814 | 12/1995 | Ohshima et al. | 438/629 |
| 5,563,097 | 10/1996 | Lee | 438/620 |

FOREIGN PATENT DOCUMENTS

| | | | |
|---|---|---|---|
| 5-90207 | 4/1993 | Japan | 438/360 |
| 5-234940 | 9/1993 | Japan | |

*Primary Examiner*—T. N. Quach
*Attorney, Agent, or Firm*—Finnegan, Henderson, Farabow, Garrett & Dunner, L.L.P.

[57] ABSTRACT

In a method of manufacturing a semiconductor device having a multilayer wiring structure, it has at least two underlying layers having different etching conditions. Firstly, the native oxide film formed on one of the underlying layers, or a barrier metal layer, is etched out under etching conditions suitable for the barrier metal layer. Then, the surface of the barrier metal layer is capped with a plugging material having etching conditions similar to or substantially the same as those of the other one of the underlying layers, or a lower wiring layer. Subsequently, the native oxide film and the etching by-product formed on the lower wiring layer are etched out under etching conditions suitable for the lower wiring layer. Thereafter, contact holes for the two underlying layers are buried with a conductive substance to establish electric connection with their respective upper conductive layers. With the above described steps, the entire manufacturing process is significantly simplified and the time required for burying the contact holes is greatly reduced without remarkably increasing the contact resistance between the barrier metal layer and the lower wiring layer and the respective buried conductive substances.

6 Claims, 4 Drawing Sheets

METHOD OF MANUFACTURING SEMICONDUCTOR DEVICE HAVING A MULTILAYER WIRING

BACKGROUND OF THE INVENTION

1. Field of the Invention

This invention relates to a method of manufacturing a semiconductor device having a multilayer wiring structure and, more particularly, it relates to an improved method of burying a conductive substance into a contact hole for interconnecting the wires of upper layers and those of lower layers of a semiconductor device.

2. Description of the Related Art

In a conventional method of manufacturing a semiconductor device having a multilayer wiring structure, a conductive substance is buried into a contact hole typically by means of a selective chemical vapor deposition technique in order to interconnect the wires of upper layers and those of lower layers of the device.

With such a selective chemical vapor deposition technique for burying a conductive substance into a contact hole, the native oxide film on the surface of a lower conductive layer exposed at the bottom of the contact hole are removed typically by plasma etching prior to performing the chemical vapor deposition. This is necessary in order to improve the electric contact between the lower conductive layer and the conductive substance and reduce the contact resistance between them.

Of lower conductive layers, the first conductive layer formed on a semiconductor substrate may be an impurity diffusion layer or a lower wiring layer. Since a diffusion layer and a lower wiring layer are formed of materials that are different from each other, different conditions are selected for them for etching out the native oxide film formed thereon. In other words, the native oxide film on a diffusion layer and the native oxide film on a lower wiring layer have to be etched out under different conditions specifically selected for them.

Thus, if a semiconductor substrate has both a diffusion layer and a lower wiring layer, different optimum conditions have to be selected for them in order to appropriately remove the native oxide films formed on the diffusion layer and the one on the lower wiring layer. Here arises a problem that the operation of burying a conductive substance into a contact hole for the diffusion layer and that of burying a conductive substance into a contact hole for the lower wiring layer cannot be carried out simultaneously.

FIGS. 3A through 3F of the accompanying drawings illustrate steps of burying a conductive substance into contact holes when a semiconductor substrate has two different underlying layers.

Assume now that a diffusion layer 102 and a TiSi$_2$ barrier metal layer 103 are formed in a surface region of a semiconductor substrate 101 and, a WSi$_2$ lower wiring layer 105 is also arranged on the semiconductor substrate 101 with an insulation film 104 disposed therebetween (FIG. 3A). Native films 106 and 107 are formed respectively on the barrier metal layer 103 and the lower wiring layer 105.

If a Cl (chlorine)-containing gas is applied to the native oxide films 106 and 107 in order to remove them in a plasma etching operation, TiClx and SiClx are then formed on the barrier metal (TiSi$_2$) layer 103. Thereafter, the TiClx and SiClx are removed by annealing at about 250° C. (FIG. 3B). Thus, when a contact hole 108 is buried with a conductive substance 109 such as tungsten (W) by selective CVD in order to connect the barrier metal 103 and an upper conductive layer (not shown) that will be formed in a subsequently step, a good electric contact is established between the barrier metal 103 and the layer of the conductive substance 109.

However, with the above etching operation using a Cl-containing gas, etching by-products 110 such as WClx and SiClx are produced on native oxide film 107 on the lower wiring layer (WSi$_2$) 105. Since WClx shows a low vapor pressure characteristic, it may not practically be removed by annealing and, consequently, the lower wiring layer 105 may not be electrically connected well with a conductive substance 109 if a contact hole 111 is buried with the conductive substance. In other words, the produced WClx significantly increases the contact resistance between the buried conductive substance 109 and the lower wiring layer 105.

If, on the other hand, a F-containing gas is applied to the native oxide films 106 and 107 in order to remove them in a plasma etching operation, etching by-products such as WFx and SiFx can be produced on the lower wiring layer 105 although the oxide film 107 may be removed. Since WFx and SiFx show a high vapor pressure characteristic, they can be removed easily. Thus, a good electric contact is established between the conductive substance 109 buried in the contact hole 111 and the lower wiring layer 105.

However, the native oxide film 106 on the barrier metal layer 103 is not removed by the above etching operation using a F-containing gas and etching by-products such as TiFx and SiFx can be produced on the native oxide film. Since TiFx shows a low vapor pressure characteristic, it may not practically be removed by annealing and, consequently, the barrier metal layer 103 may not be electrically connected well with a conductive substance 109 if the contact hole 108 is buried with the conductive substance. In other words, the produced TiFx significantly increases the contact resistance between the buried conductive substance 109 and the barrier metal layer 103.

In order to solve this problem, after burying the contact hole 108 with a conductive substance 109 (FIG. 3C), the native oxide film 107 and the etching by-products 110 are conventionally removed by plasma etching using a F-containing gas as described above. Then, the contact hole 111 is buried with the conductive substance 109 by carrying out a selective CVD operation once again (FIG. 3E).

Subsequently, an upper conductive layer 112 connected to the lower barrier metal layer 103 by way of the conductive substance 109 in the contact hole 108 and another upper conductive layer 112 connected to the lower wiring layer 105 by way of the conductive substance 109 in the contact hole 111 are formed by forming an Al layer and patterning thereof.

Thus, the contact hole 108 connected to the barrier metal layer 103 on the diffusion layer 102 and the contact hole 111 connected to the lower wiring layer 105 cannot be buried with the conductive substance 109 simultaneously according to a conventional method so that a large number of manufacturing steps are required and a long time has to be required for the burying operations.

As described above, if a semiconductor substrate has two or more lower conductive layers and their respective contact holes are buried with a conductive substance simultaneously by means of a known selective CVD technique, there arises a problem that no good electric contact may be established between the conductive substance buried in each of the contact holes and the related underlying conductive layers because the optimum etching conditions for removing the native oxide films formed on the underlying conductive layers can vary significantly for each of the underlying layers.

SUMMARY OF THE INVENTION

In view of the above identified problem, it is therefore an object of the present invention to provide a method of manufacturing a semiconductor device comprising two or more lower conductive layers existing as underlying layers, that can establish a good electric contact between each of the underlying conductive layers and a conductive substance buried in a related one of the contact holes of the device so that consequently the number of steps and the time required for manufacturing the semiconductor device may be significantly reduced.

According to the invention, the above object is achieved by providing a method of manufacturing a semiconductor device comprising: a first step of forming at least two underlying layers having different etching conditions on a surface of a semiconductor substrate; a second step of forming an insulation film on the semiconductor substrate; a third step of forming contact holes through the insulation film leading respectively to the at least two underlying layers to expose portions of surfaces of the at least two underlying layers; a fourth step of etching out native oxide films on the surface portions of the underlying layers which is exposed respectively to the bottoms of the contact holes formed through the insulation film; a fifth step of coating the surface of one of the underlying layers cleared of the native oxide film with a plugging material having etching conditions similar to those of the other underlying layer; a sixth step of etching out the native oxide film existing on the surface of the other underlying layer under etching conditions suitable for the other underlying layer; a seventh step of burying the contact holes with a conductive substance to form respective connection layers; and an eighth step of forming upper conductive layers electrically connected to the respective underlying layers by way of the respective connection layers buried in the respective contact holes.

With a method of the present invention as described above, since one of the underlying layers is coated with a plugging material having etching conditions similar to or substantially the same as those of the other underlying layer, the etching by-products formed on the plugging material and those formed on the other underlying layer in a subsequent step may show respective vapor pressure characteristics that are similar to each other so that common optimum etching conditions may be selected for the both underlying layers.

Now, the present invention will be described by referring to the accompanying drawings that illustrate preferred modes of carrying out the invention.

DETAILED DESCRIPTION OF THE PREFERRED EMBODIMENTS

FIGS. 1A through 1J are schematic sectional views of a semiconductor device having a multilayer wiring structure and illustrated in different manufacturing steps according to the invention.

Figure 1A:
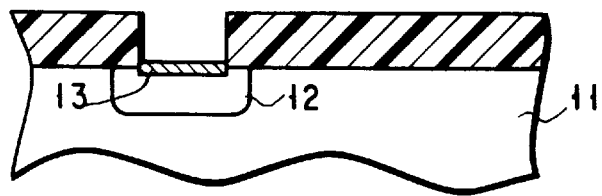
FIGS. 1A through 1J are schematic sectional views of a semiconductor device in different manufacturing steps according to the invention.

Firstly, as shown in FIG. 1A, a photoresist layer is formed on the surface of a semiconductor substrate 11. The photoresist layer has a predetermined pattern defining openings at predetermined respective positions. The exposed surface areas of the semiconductor substrate 11 are doped with a p- or n-type semiconductor impurity to a high concentration, using the photoresist layer as a mask, to form a first conductive layer, or an impurity diffusion layer 12, that constitutes one of two different underlying layers. Thereafter, typically titanium (Ti) is deposited on the impurity diffusion layer 12 by selective CVD to form a barrier metal ($TiSi_2$) layer 13 on the impurity diffusion layer 12.

Figure 1B:
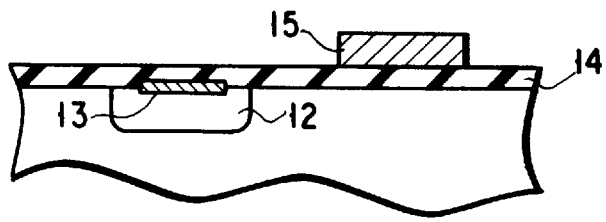

Subsequently, the photoresist layer is removed and then, as shown in FIG. 1B, an insulation film 14 is surfacewise formed on the surface of the semiconductor substrate 11 by means of a known technique such as thermal heating. Then, typically tungsten (W) is deposited on predetermined areas of the insulation film 14 by CVD to form a first conductive layer, or an under wiring ($WSi_2$) layer 15, that constitutes the other one of the two different underlying layers.

Figure 1C:
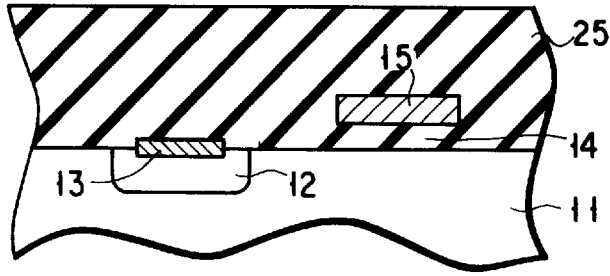
Figure 1D:
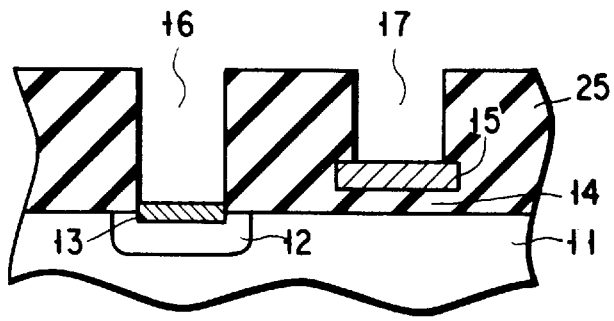

Then, as shown in FIG. 1C, another insulation layer 25 is surfacewise formed on the surface of the semiconductor substrate 11 by means of a known technique such as thermal heating. Then, as shown in FIG. 1D, contact holes 16 and 17 are formed in such a way that these contact holes 16 and 17 respectively open to the barrier metal ($TiSi_2$) layer 13 formed on the impurity diffusion layer 12 and the lower wiring layers 15.

Figure 1E:
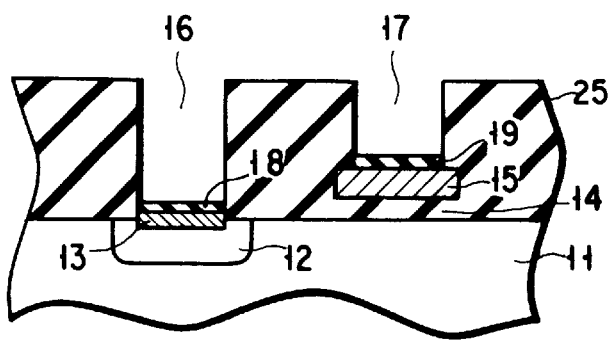

Since the surfaces of the barrier metal layer 13 and the lower wiring layer 15 are exposed to atmosphere, then, as shown in FIG. 1E, a native oxide film 18 is formed on the exposed surface of the barrier metal layer 13 located at the bottom of the contact hole 16, while another native oxide film 19 is formed on the exposed surface of the lower wiring layer 15 located at the bottom of the contact hole 17.

Thereafter, a plasma etching operation is carried out, using a gas suitable for the etching conditions of the barrier metal layer 13 such as Cl-containing $BCl_3$ gas.

Figure 1F:
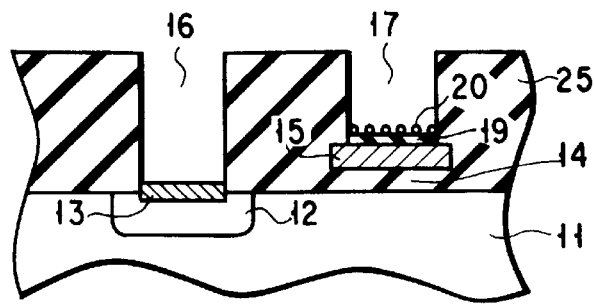

As a result, as shown in FIG. 1F, the native oxide film 18 (FIG. 1E) on barrier metal layer 13 is etched out. Also with the plasma etching operation, a chloride or an etching by-product (WClx) 20 is formed on the surface of the native oxide film 19 on said lower wiring layer 15.

Note that the above plasma etching operation is conducted at a temperature suitable for removing the etching by-product formed from the native oxide film 18, or TiClx, that shows a high vapor pressure characteristic. It may alternatively be conducted at room temperature. If it is conducted at room temperature, an annealing operation has to be subsequently carried out at a temperature suitable for removing the etching by-product, or TiClx, without difficulty.

Figure 1G:
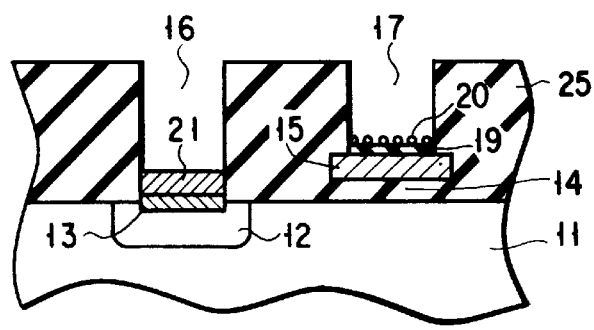

After the native oxide film 18 on the barrier metal layer 13 is removed, as shown in FIG. 1G, a plugging layer (cap layer) 21 is deposited on the surface of the barrier metal layer 13 in the contact hole 16 by selective CVD.

Note that a conductive substance having etching conditions similar to or the same as those of the lower wiring layer 15 has to be selected for the plugging layer 21. In this embodiment of the invention, tungsten (W) is used from the viewpoint of etching conditions.

Note also that the plugging layer 21 is formed to a thickness slightly greater than that of the native oxide film 19 on the lower wiring layer 15 plus that of the etching by-product 20 because the plugging layer 21 will be etched by the thickness equal to the above sum in a subsequent etching operation, which will be described below.

Figure 1H:
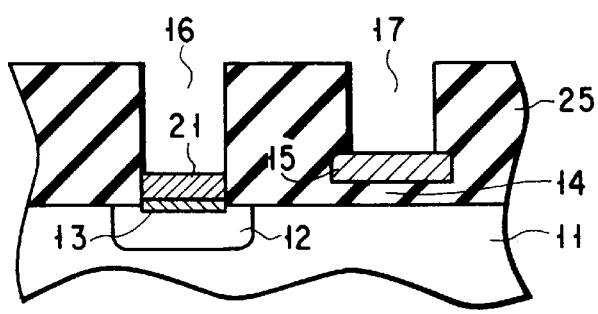

Then, a plasma etching operation is carried out, using a gas suitable for the etching conditions of the lower wiring layer 15 such as F-containing $SF_6$ gas. With this operation, the native oxide film 19 on said lower wiring layer 15 and the etching by-product 20 are also removed. At the same time, the surface of the plugging material 21 is also etched off as shown in FIG. 1H.

Note that, as in the above described case of plasma etching using $BCl_3$, this plasma etching operation is conducted at a temperature suitable for removing the etching by-product formed from the native oxide film 19 on the lower wiring layer 15, or WFx, that shows a high vapor pressure characteristic. It may alternatively be conducted at room temperature. If it is conducted at room temperature, an annealing operation has to be subsequently carried out at a temperature suitable for removing the etching by-product, or TiClx, without difficulty.

Since, as described above, the native oxide film 18 is removed and the surface of the exposed barrier metal layer 13 is covered by a plugging layer 21 having etching conditions similar to or substantially the same as those of the lower wiring layer 15, the to-be-etched layer in the contact hole 16 (plugging layer 21) and the to-be-etched layer in the contact hole 17 (lower wiring layer 15) become to have similar or substantially the same etching conditions.

Figure 1I:
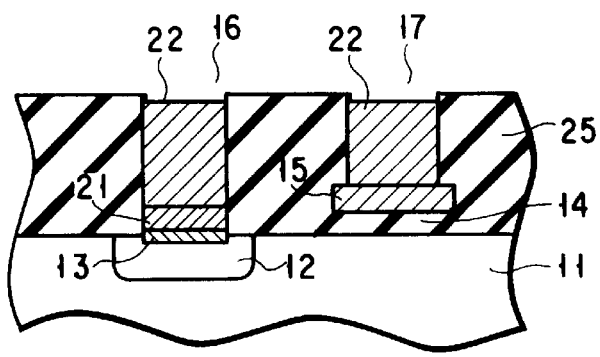

After the native oxide film 19 and the etching by-product 20 on the lower wiring layer 15 are removed, the contact holes 16 and 17 are buried with a same conductive substance (e.g., tungsten (W)) 22 to form connection layers 22 there as shown in FIG. 1I.

Figure 1J:
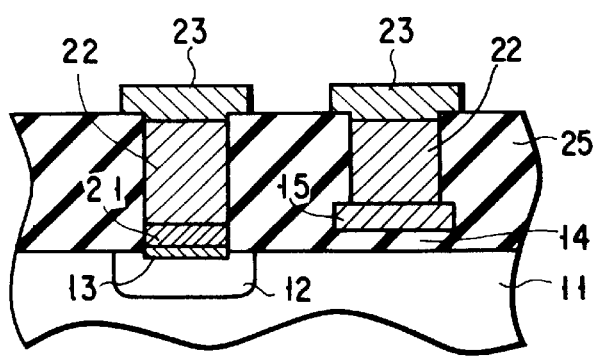

Then, typically an aluminum layer is surfacewise formed on the surface of the substrate by means of a known technique and patterned to form conductive layers 23 on the respective connection layers 22 as shown in FIG. 1J.

Figure 2:
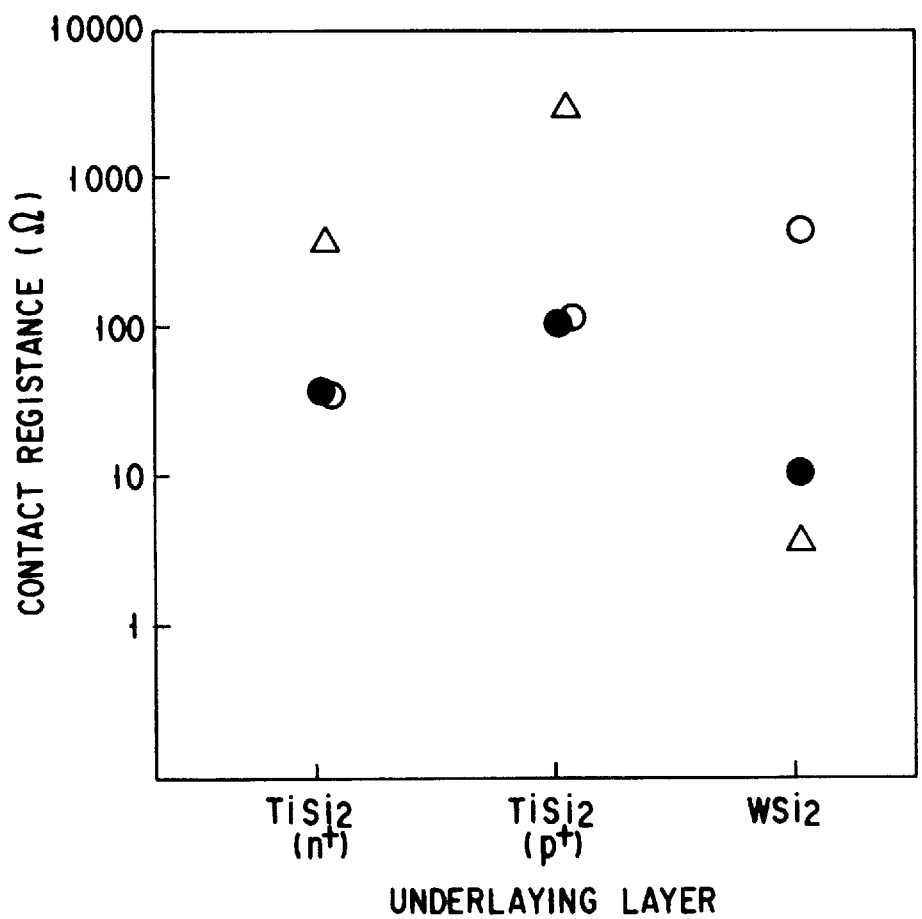
FIG. 2 is a graph showing the relationship between an underlying layer and the contact resistance in different processes.
Figure 3A:
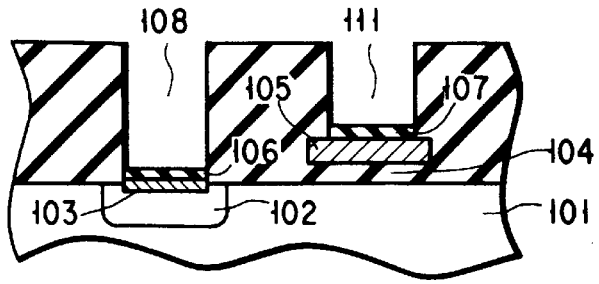
FIGS. 3A through 3F are schematic sectional views of a semiconductor device in different manufacturing steps according to a conventional manufacturing method.
Figure 3B:
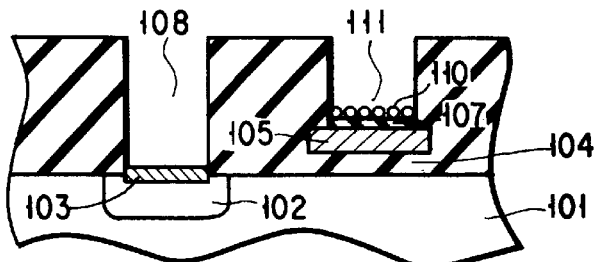
Figure 3C:
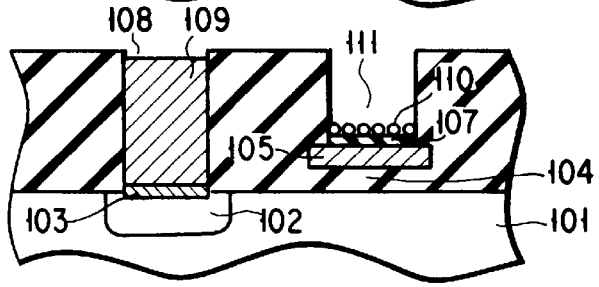
Figure 3D:
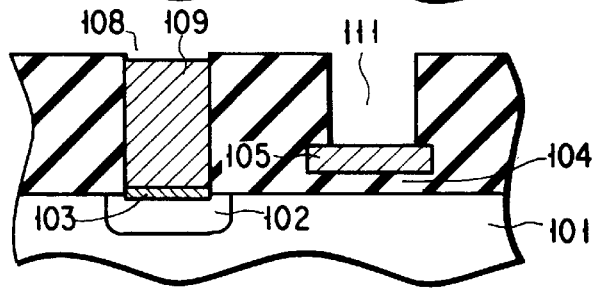
Figure 3E:
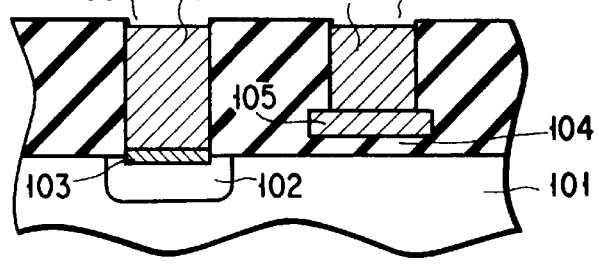
Figure 3F:
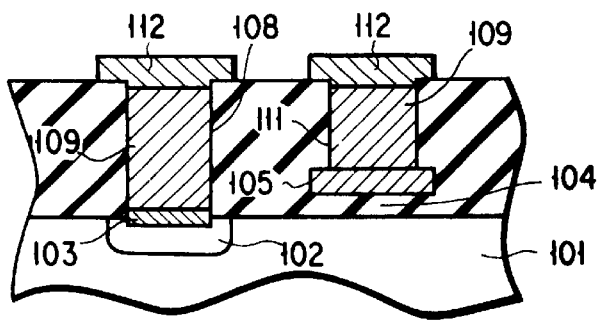

FIG. 2 is a graph showing the contact resistance values obtained in an experiment conducted on $TiSi_2$ ($n^+$), $TiSi_2$ ($p^+$) and $WSi_2$ ($n^+$), using a four terminal method. Note that the black spots in the graph indicate the values obtained by the method of the present invention, whereas the white spots indicate the values obtained by using etching conditions suitable only for $TiSi_2$ and the white trigons indicate the values obtained by using etching conditions suitable only for $WSi_2$.

It may be seen from the graph that the measured contact resistance values of the underlying layers $TiSi_2$ ($n^+$), $TiSi_2$ ($p^+$) and $WSi_2$ ($n^+$) obtained by the method of the present invention are close to their proper values. In other words, the underlying layers showed a good electric contact with the conductive substance 22 buried in the contact holes 16 and 17.

Note that, as described above, the etching by-products on the underlying layers of a semiconductor device manufactured by a method according to the invention shows vapor pressures that are close to each other.

More specifically, the native oxide film on the barrier metal layer is etched out under etching conditions suitable for the barrier metal and the exposed surface of the barrier metal is coated with a plugging material having etching conditions similar to or substantially the same as those of the lower wiring layer so that the latter (and the plugging material) may be etched under suitable conditions. With such an arrangement, optimum etching conditions may be selected for all the exposed underlying layers at the respective bottoms of the contact holes. Thus, even if two or more underlying layers having different etching conditions and their related contact holes are buried with a conductive substance simultaneously, a good electric contact can be secured between each and every underlying layer and the related conductive substance so that the entire manufacture process can be significantly simplified and the time for burying the contact holes is reduced to a half of the time required for burying them in a known manufacturing process.

What is remarkable about the method of the present invention is that the contact resistance of each underlying layer of a semiconductor device manufactured by the method is not significantly increased, if it is produced by a simplified manufacturing process with a reduced time of burying the contact holes.

While the barrier metal layer 13 is capped by a plugging material 21 in the above description, it may alternatively be etched under suitable conditions after capping the lower wiring layer 15.

Again, while a barrier metal layer ($TiSi_2$) and a lower wiring layer ($WSi_2$) are combined as underlying layers in the above description, AlSix and WSix may alternatively be combined. In short, conductive layers having different etching conditions can be combined appropriately according to the invention.

It may be understood that the above described embodiment of the invention is subject to alterations and variations without departing from the scope of the present invention.

As described above, the present invention provides a method of manufacturing a semiconductor device comprising two or more lower conductive layers existing as underlying layers that can establish a good electric contact between each of the underlying conductive layers and a conductive substance buried in a related one of the contact holes of the device so that consequently the number of steps and the time required for manufacturing the semiconductor device may be significantly reduced.

What is claimed is:

1. A method of manufacturing a semiconductor device comprising:

a first step of forming first and second underlying layers on a surface of a semiconductor substrate, wherein said first underlying layer responds differently than said second underlying layer to an etching operation;

a second step of forming an insulation film on said semiconductor substrate;

a third step of forming contact holes through said insulation film leading respectively to said first and second underlying layers to expose surfaces of said underlying layers;

a fourth step of etching out a native oxide film on the surface of said first underlying layer;

a fifth step of coating the surface of said first underlying layer cleared of said native oxide film with a plugging material, wherein said plugging material responds substantially the same as said second underlying layer to an etching operation;

a sixth step of etching out a native oxide film and an etching by-product formed during said fourth step on the surface of said second underlying layer using an etching operation different from the etching operation used in the fourth step;

a seventh step of burying said contact holes with a conductive substance to form respective connection layers; and an eighth step of forming upper conductive layers electrically connected to the respective underlying layers by way of said respective connection layers buried in said respective contact holes.

2. A method of manufacturing a semiconductor device according to claim 1, wherein in the first step, a first conductive layer of $TiSi_2$ is formed on the surface of the semiconductor substrate as said first underlying layer and a second conductive layer of $WSi_2$ is formed on the semiconductor substrate as said second underlying layer.

3. A method of manufacturing a semiconductor device according to claim 2, wherein a plasma etching operation is conducted on the surface of said $TiSi_2$, using Cl or a Cl-containing gas in the fourth step.

4. A method of manufacturing a semiconductor device according to claim 2, wherein a cap layer of W is formed on the surface of said $TiSi_2$ in the fifth step to a thickness greater than the thickness of the native oxide film existing on the surface of said $WSi_2$ plus that of the etching by-product formed in said fourth step.

5. A method of manufacturing a semiconductor device according to claim 2, wherein the sixth step consists in a plasma etching operation to be conducted on the surface of said $WSi_2$, using F or a F-containing gas.

6. A method of manufacturing a semiconductor device according to claim 1, wherein the seventh step consists of an operation of burying W by means of a selective CVD technique.

* * * * *